US012640713B2

(12) United States Patent
Kang et al.

(10) Patent No.: US 12,640,713 B2
(45) Date of Patent: May 26, 2026

(54) LOW POWER FLIP-FLOP

(71) Applicant: Samsung Electronics Co., Ltd., Suwon-si (KR)

(72) Inventors: Byounggon Kang, Suwon-si (KR); Dalhee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 18/377,777

(22) Filed: Oct. 7, 2023

(65) Prior Publication Data

US 2024/0128952 A1 Apr. 18, 2024

(30) Foreign Application Priority Data

Oct. 13, 2022 (KR) ........................ 10-2022-0131764
Dec. 22, 2022 (KR) ........................ 10-2022-0182174

(51) Int. Cl.
*H03K 3/012* (2006.01)
*G01R 31/3185* (2006.01)
*H03K 3/037* (2006.01)
*H03K 19/20* (2006.01)

(52) U.S. Cl.
CPC ..... *H03K 3/012* (2013.01); *G01R 31/318541* (2013.01); *H03K 3/0372* (2013.01); *H03K 19/20* (2013.01)

(58) Field of Classification Search
CPC .. H03K 3/35625; H03K 19/20; H03K 3/0372; H03K 3/012; H03K 3/037; H03K 3/027; H03K 3/02
See application file for complete search history.

(56) References Cited

U.S. PATENT DOCUMENTS

| | | | |
|---|---|---|---|
| 10,270,430 B2 | 4/2019 | Guo et al. | |
| 10,396,761 B2 * | 8/2019 | Hwang | .................. H03K 3/012 |
| 10,505,523 B2 | 12/2019 | Savanth et al. | |
| 11,005,459 B1 | 5/2021 | Hess et al. | |
| 11,025,236 B1 * | 6/2021 | Lai | ..................... H03K 3/35625 |
| 11,387,817 B2 | 7/2022 | Kang et al. | |
| 2022/0247391 A1 | 8/2022 | Li et al. | |

FOREIGN PATENT DOCUMENTS

KR 102191533 B1 12/2020

* cited by examiner

*Primary Examiner* — Diana J. Cheng
(74) *Attorney, Agent, or Firm* — Muir Patent Law, PLLC

(57) ABSTRACT

A low power flip-flop includes a master section including a multiplexer, a first AND-OR-Inverter (AOI) gate circuit, a second AOI gate circuit, and a first inverter circuit and configured to receive a data input signal, a scan input signal, a scan enable signal, and an inverted scan enable signal, and output a second internal signal and a third internal signal, a slave section including a third AOI gate circuit, a fourth AOI gate circuit, and a second inverter circuit, and configured to receive the second and third internal signals to output an output signal, and a third inverter circuit configured to generate the inverted scan enable signal. The first to fourth AOI gate circuits are configured to receive a clock signal.

17 Claims, 13 Drawing Sheets

LOW POWER FLIP-FLOP

CROSS-REFERENCE TO RELATED APPLICATIONS

This application is based on and claims priority under 35 U.S.C. § 119 to Korean Patent Application Nos. 10-2022-0131764, filed on Oct. 13, 2022, and 10-2022-0182174, filed on Dec. 22, 2022, in the Korean Intellectual Property Office, the disclosure of each of which is incorporated by reference herein in its entirety.

BACKGROUND

The present disclosure relates to a flip-flop, and more particularly, to a low-power flip-flop.

Mobile devices such as smartphones and tablet personal computers (PCs) need low-power designs. Since a flip-flop occupies a high portion of a processor inside a mobile device, reducing the power consumption of the flip-flop may be one solution for driving the mobile device with low power.

Flip-flops may consume power according to the logic level transition of the clock signal even if the data change is not large. These flip-flop characteristics may have a significant effect on power consumption, especially in systems with low switching activity. Therefore, a method of reducing power consumed by a flip-flop when there is little change in data is beneficial.

SUMMARY

The inventive concept provides a low-power flip-flop with reduced power consumption.

According to an aspect of the inventive concept, there is provided a flip-flop that receives a data input signal, a scan input signal, a scan enable signal, and an inverted scan enable signal. The flip-flop includes a master section and a slave section. The master section includes a multiplexer, a first AND-OR-Inverter (AOI) gate circuit, a second AOI gate circuit, and a first inverter circuit. The master section is configured to receive the data input signal, the scan input signal, the scan enable signal, and the inverted scan enable signal and output a second internal signal from the second AOI gate circuit in response to a first internal signal output from the multiplexer and first AOI gate circuit and a third internal signal and output the third internal signal. The slave section includes a third AOI gate circuit, a fourth AOI gate circuit, and a second inverter circuit. The slave section is configured to receive the second internal signal and the third internal signal, and output a flip-flop output signal from the second inverter circuit by inverting a fourth internal signal output from the third AOI gate circuit, and a third inverter circuit configured to generate the inverted scan enable signal obtained by inverting the scan enable signal, The third AOI gate circuit is configured to output the fourth Internal signal In response to a fifth internal signal output from the fourth AOI gate circuit and the second internal signal. The first to fourth AOI gate circuits are configured to receive a clock signal.

According to another aspect of the inventive concept, there is provided a flip-flop that receives a data input signal, a scan input signal, a scan enable signal, and an inverted scan enable signal. The flip-flop includes a master section, a slave section, and third and fourth inverter circuits. The master section includes a multiplexer, a first OR-AND-Inverter (OAI) gate circuit, a second OAI gate circuit, and a first inverter circuit. The master section is configured to receive the data input signal, the scan input signal, the scan enable signal, and the inverted scan enable signal, output a second internal signal from the second OAI gate circuit in response to a first internal signal output from the multiplexer and first OAI gate circuit and a third internal signal, and output the third internal signal from the first inverter circuit by inverting the second internal signal. The slave section includes a third OAI gate circuit, a fourth OAI gate circuit, and a second inverter circuit. The slave section is configured to receive the second internal signal and the third internal signal, and output a flip-flop output signal from the second inverter circuit by inverting a fourth internal signal output from the third OAI gate circuit. The third inverter circuit is configured to generate the inverted scan enable signal obtained by inverting the scan enable signal. The fourth inverter circuit is configured to generate an inverted clock signal by inverting a clock signal. The third OAI gate circuit is configured to output the fourth internal signal in response to a fifth internal signal output from the fourth OAI gate circuit and the second internal signal. The multiplexer and first AOI gate circuit, the second, third, and fourth OAI gate circuits are configured to respectively output the first, second, fourth, and fifth internal signals in response to the inverted clock signal.

According to another aspect of the inventive concept, there is provided a multi-bit flip-flop including a plurality of 1-bit flip-flops. The plurality of 1-bit flip-flops includes a first flip-flop and a second flip-flop. Each of the first and second flip-flops includes a master section and a slave section. The master section includes a first master stage configured to receive a data input signal, a scan input signal, a scan enable signal, an inverted scan enable signal, and a second internal signal, and generate a first internal signal in response to a clock signal or an inverted clock signal, a second master stage configured to receive the first internal signal and a third internal signal, and generate the second internal signal in response to the clock signal or the inverted clock signal, and a third master stage configured to receive the second internal signal and generate the third internal signal by inverting the second internal signal. The slave section includes a first slave stage configured to receive the second internal signal and a fifth internal signal, and generate a fourth internal signal in response to the clock signal or the inverted clock signal, a second slave stage configured to receive the third internal signal and generate the fifth internal signal in response to the clock signal or the inverted clock signal, and a third slave stage configured to receive the fourth internal signal and generate an output signal by inverting the fourth internal signal. An output signal of the first flip-flop is input to the second flip-flop as a scan input signal.

BRIEF DESCRIPTION OF THE DRAWINGS

Embodiments will be more clearly understood from the following detailed description taken in conjunction with the accompanying drawings in which:

FIG. 3 is a logic diagram illustrating a flip-flop according to an embodiment;

FIGS. 4 to 6 are circuit diagrams illustrating flip-flops according to embodiments of the inventive concept;

FIG. 7 is a diagram illustrating logic symbols of a flip-flop according to an embodiment;

FIGS. 11 and 12 are circuit diagrams illustrating flip-flops according to embodiments of the inventive concept.

DETAILED DESCRIPTION

Hereinafter, example embodiments of the inventive concept will be described in detail with reference to the accompanying drawings.

Figure 1:
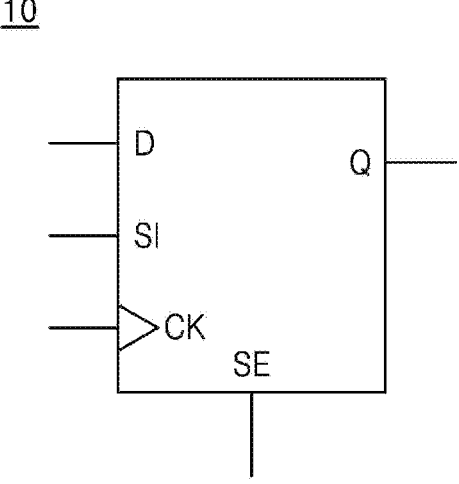
FIG. 1 is a diagram illustrating logic symbols of a flip-flop according to an embodiment.

FIG. 1 is a diagram illustrating logic symbols of a flip-flop 10 according to an embodiment. The flip-flop 10 may be a 1-bit flip-flop that receives a 1-bit data input signal D.

The flip-flop 10 may be included in an integrated circuit included in an electronic device. For example, the electronic device may be a mobile phone, a smartphone, a tablet, a personal digital assistant (PDA), a laptop, a computer, a wearable computing device, a server, a vehicle infotainment device, or an Internet of Things (IoT) device. The integrated circuit may include a plurality of standard cells defined in a cell library, and the plurality of standard cells may, for example, include an OR gate, an AND gate, a NOR gate, a NAND gate, an inverter, an OR-AND-Inverter (OAI) gate, an AND-OR-Inverter (AOI) gate, a flip-flop, or a latch.

Referring to FIG. 1, the flip-flop 10 receives a data input signal D, a scan input signal SI, and a scan enable signal SE, and outputs an output signal Q according to a clock signal CK. The flip-flop 10 may be included in a scan chain operating as a scan test circuit.

The flip-flop 10 may store or latch the data input signal D based on the scan enable signal SE and the clock signal CK, and perform a scan test operation by selecting the scan input signal SI to output an output signal Q. The scan test operation may set a certain number of flip-flops included in the scan chain through a scan enable signal SE and a scan input signal SI, and may be performed by inputting a certain test pattern to the scan chain to verify the accuracy of the flip-flop from the output signal of the scan chain.

The number of transistors operating according to the clock signal CK is reduced in the flip-flop 10 according to the inventive concept, so that the loading capacitance of the clock signal CK may be reduced and power consumption of the flip-flop 10 may be reduced.

Figure 2:
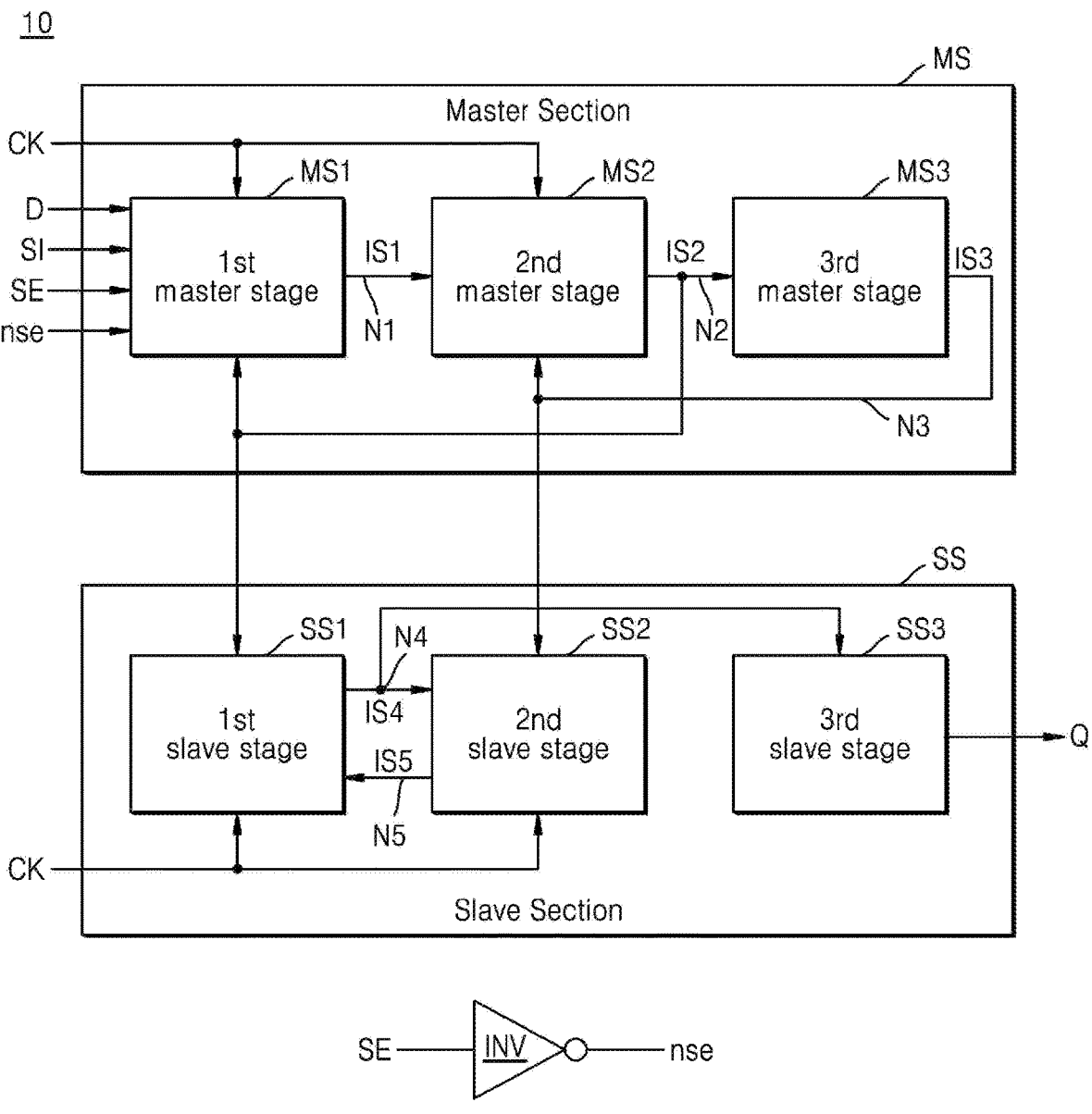
FIG. 2 is a block diagram illustrating a flip-flop according to an embodiment.

FIG. 2 is a block diagram illustrating a flip-flop 10 according to an embodiment.

Referring to FIG. 2, the flip-flop 10 may include a master section MS, a slave section SS, and an inverter circuit INV. The inverter circuit INV may receive the scan enable signal SE and generate an inverted scan enable signal nse by inverting the scan enable signal SE.

The master section MS may include first to third master stages MS1 to MS3. The first master stage MS1 may receive a data input signal D, a scan input signal SI, a scan enable signal SE, an inverted scan enable signal nse, and a second internal signal IS2, and generate a first internal signal IS1 in response to a clock signal CK. The first master stage MS1 may output the first internal signal IS1 through a first node N1 as an output node.

The second master stage MS2 may receive the first internal signal IS1 and a third internal signal IS3 and generate the second internal signal IS2 in response to the clock signal CK. The second master stage MS2 may output the second internal signal IS2 through a second node N2 as an output node.

The third master stage MS3 may receive the second internal signal IS2 and generate the third internal signal IS3. The third master stage MS3 may include an inverter and output the third internal signal IS3 obtained by inverting the second internal signal IS2 through a third node N3, that is, an output node.

The slave section SS may include first to third slave stages SS1 to SS3. The first slave stage SS1 may receive the second internal signal IS2 and a fifth internal signal IS5 and generate a fourth internal signal IS4 in response to the clock signal CK. The first slave stage SS1 may output the fourth internal signal IS4 through a fourth node N4, that is, an output node.

The second slave stage SS2 may receive the third internal signal IS3 and the fourth internal signal IS4 and generate the fifth internal signal IS5 in response to the clock signal CK. The second slave stage SS2 may output the fifth internal signal IS5 through a fifth node N5, that is, an output node.

The third slave stage SS3 may receive the fourth internal signal IS4 and generate an output signal Q. The third slave stage SS3 may include an inverter and output an output signal Q obtained by inverting the fourth internal signal IS4.

Figure 3:
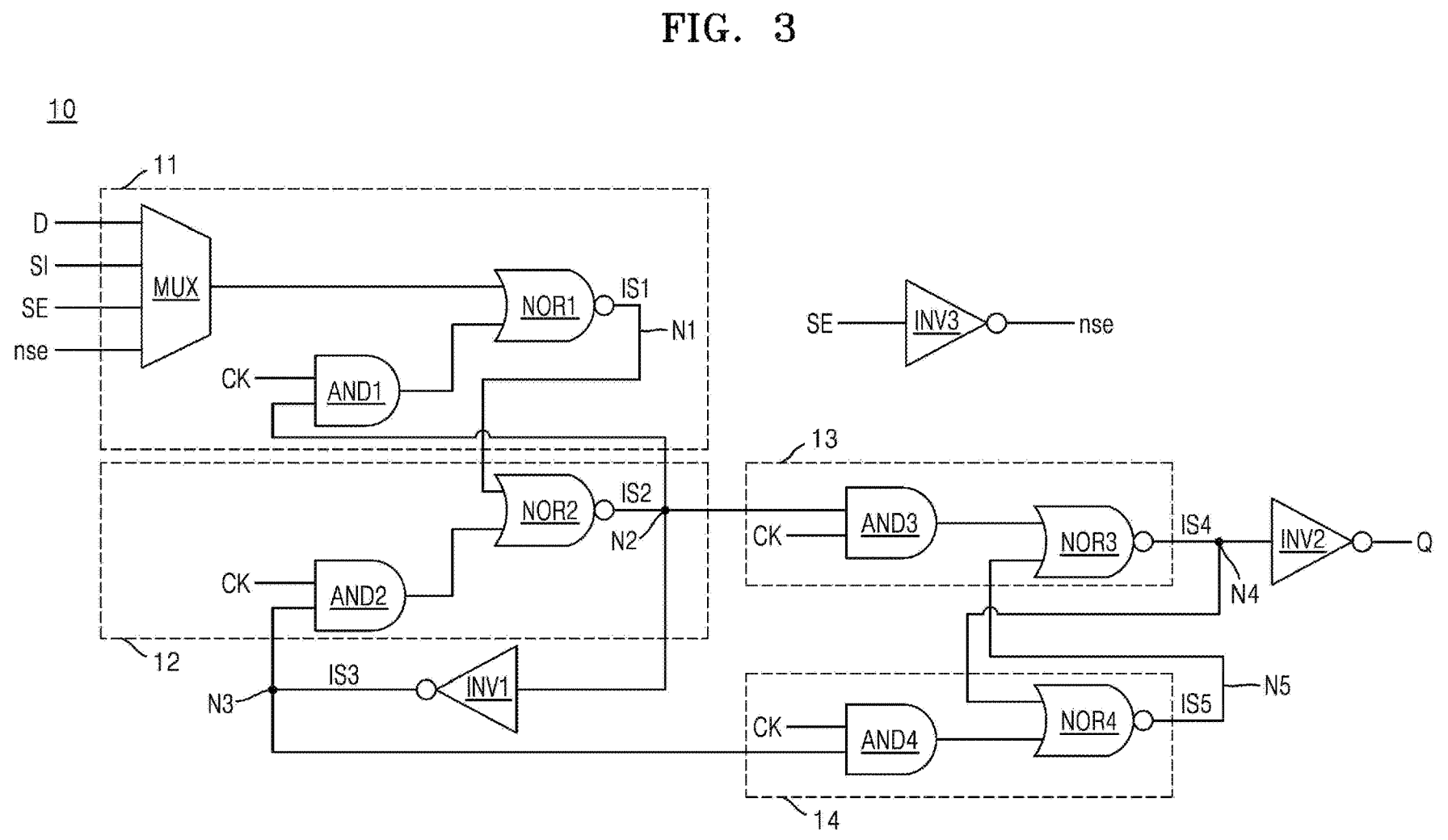

FIG. 3 is a logic diagram illustrating a flip-flop 10 according to an embodiment.

Referring to FIGS. 2 and 3, the flip-flop 10 includes a multiplexer and first AOI gate circuit 11, a second AOI gate circuit 12, a third AOI gate circuit 13, a fourth AOI gate circuit 14, and a first inverter circuit INV1, a second inverter circuit INV2, and a third inverter circuit INV3. The third inverter circuit INV3 of FIG. 3 may be the inverter circuit INV of FIG. 2. The multiplexer and first AOI gate circuit 11, the second AOI gate circuit 12, the third AOI gate circuit 13, and the fourth AOI gate circuit 14 may be implemented as AOI21 gates.

The first master stage MS1 of FIG. 2 may include the multiplexer and first AOI gate circuit 11, the second master stage MS2 of FIG. 2 may include the second AOI gate circuit 12, and the third master stage MS3 of FIG. 2 may include the first inverter circuit INV1.

The multiplexer and first AOI gate circuit 11 may perform operations of a multiplexer MUX, an AND gate AND1, and a NOR gate NOR1. The multiplexer MUX may provide the data input signal D or the scan input signal SI to the NOR gate NOR1 according to a logic level of the scan enable signal SE. The multiplexer MUX may receive not only the scan enable signal SE but also the inverted scan enable signal nse. The AND gate AND1 may perform an AND operation by receiving the clock signal CK and a second internal signal IS2, and the NOR gate NOR1 may receive an output of the multiplexer MUX and an output of the AND gate AND1, perform a NOR operation on the received inputs and output a first internal signal IS1 to a first node N1.

The second AOI gate circuit 12 may perform operations of an AND gate AND2 and a NOR gate NOR2. The AND gate AND2 may receive the clock signal CK and a third internal signal (e.g., IS3 of FIG. 2) and perform an AND operation on the received inputs. The NOR gate NOR2 may receive the first internal signal IS1 and an output of the AND gate AND2, perform a NOR operation, and output the second internal signal IS2 to a second node N2.

The first inverter circuit INV1 may generate the third internal signal IS3 by inverting the second internal signal IS2 and output the third internal signal IS3 to the third node N3. Accordingly, the master section MS may provide the internal signal (i.e., the second internal signal IS2) and the inverted internal signal (i.e., the third internal signal IS3) to the slave section SS.

The first slave stage SS1 of FIG. 2 may include the third AOI gate circuit 13, the second slave stage SS2 of FIG. 2 may include the fourth AOI gate circuit 14, and the third slave stage SS3 of FIG. 2 may include the second inverter circuit INV2.

The third AOI gate circuit 13 may perform operations of an AND gate AND3 and a NOR gate NOR3. The AND gate AND3 may perform an AND operation by receiving the clock signal CK and the second internal signal IS2, and the NOR gate NOR3 may receive the fifth internal signal IS5 and an output of the AND gate AND3, perform a NOR operation, and output a fourth internal signal IS4 to a fourth node N4.

The fourth AOI gate circuit 14 may perform operations of an AND gate AND4 and a NOR gate NOR4. The AND gate AND4 may receive the clock signal CK and the third internal signal IS3 and perform an AND operation. The NOR gate NOR4 may receive the fourth internal signal IS4 and an output of the AND gate AND4, perform a NOR operation, and output the fifth internal signal IS5 to the fifth node N5.

The second inverter circuit INV2 may generate an output signal Q by inverting the fourth internal signal IS4 and output the output signal Q to the output terminal of the flip-flop 10.

Figure 4:
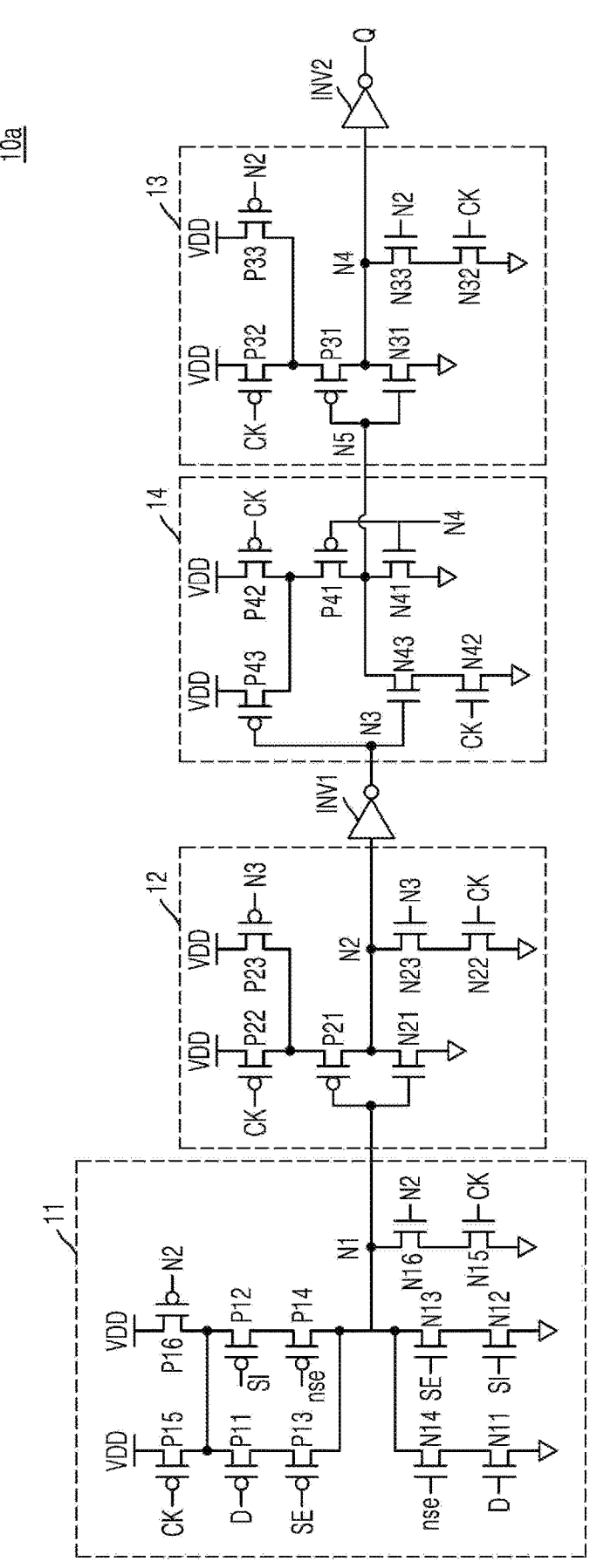

FIG. 4 is a circuit diagram illustrating a flip-flop 10a according to an embodiment. FIG. 4 is a circuit diagram showing a configuration of the flip-flop 10 excluding the third inverter circuit INV3 of FIG. 3.

Referring to FIG. 4, the flip-flop 10a may include a multiplexer and first AOI gate circuit 11, a second AOI gate circuit 12, a third AOI gate circuit 13, a fourth AOI gate circuit 14, a first inverter circuit INV1, and a second inverter circuit INV2.

The multiplexer and first AOI gate circuit 11 may include first to sixth P-type transistors P11 to P16 and first to sixth N-type transistors N11 to N16. The multiplexer and first AOI gate circuit 11 may have a structure in which the multiplexer is coupled to the AOI gate.

A source of the first P-type transistor P11 is connected to a drain of the fifth P-type transistor P15 and a drain of the sixth P-type transistor P16, and a drain of the first P-type transistor P11 may be connected to a source of the third P-type transistor P13. The data input signal D may be received through a gate of the first P-type transistor P11.

A source of the second P-type transistor P12 is connected to the drain of the fifth P-type transistor P15 and the drain of the sixth P-type transistor P16, and a drain of the second P-type transistor P12 may be connected to a source of the fourth P-type transistor P14. The scan input signal SI may be received through a gate of the second P-type transistor P12.

A drain of the third P-type transistor P13 and a drain of the fourth P-type transistor P14 may be connected to a first node N1 that is an output node of the multiplexer and first AOI gate circuit 11. A gate of the third P-type transistor P13 may receive the scan enable signal SE, and a gate of the fourth P-type transistor P14 may receive the inverted scan enable signal nse.

In contrast, the gate of the first P-type transistor P11 may receive the scan enable signal SE and the gate of the third P-type transistor P13 may receive the data input signal D. In this case, the source of the third P-type transistor P13 may be connected to the drains of the first and second P-type transistors P11 and P12.

In contrast, the gate of the second P-type transistor P12 may receive the inverted scan enable signal nse and the gate of the fourth P-type transistor P14 may receive the scan input signal SI. In this case, the source of the third P-type transistor P13 may be connected to the drain of the first P-type transistor P11 and the drain of the second P-type transistor P12.

A source of the fifth P-type transistor P15 and a source of the sixth P-type transistor P16 may be applied with a power supply voltage VDD. The clock signal CK may be received through a gate of the fifth P-type transistor P15, and a gate of the sixth P-type transistor P16 may be connected to a second node N2, which is an output node of the second AOI gate circuit 12, so that a second internal signal (e.g., IS2 of FIG. 2) may be received.

A ground voltage may be applied to a source of the first N-type transistor N11 and a source of the second N-type transistor N12. A drain of the first N-type transistor N11 may be connected to a source of the fourth N-type transistor N14, and a drain of the second N-type transistor N12 may be connected to a source of the third N-type transistor N13. The data input signal D may be received through a gate of the first N-type transistor N11, and the scan input signal SI may be received through a gate of the second N-type transistor N12.

A drain of the third N-type transistor N13 and a drain of the fourth N-type transistor N14 may be connected to the first node N1. A gate of the third N-type transistor N13 may receive the scan enable signal SE, and a gate of the fourth N-type transistor N14 may receive the inverted scan enable signal nse.

In contrast, the gate of the first N-type transistor N11 may receive the inverted scan enable signal nse and the gate of the fourth N-type transistor N14 may receive the data input signal D. In this case, the source of the fourth N-type transistor N14 may be connected to the drain of the first N-type transistor N11 and the drain of the second N-type transistor N12.

In contrast, the gate of the second N-type transistor N12 may receive the scan enable signal SE and the gate of the N-type transistor N13 may receive the scan input signal SI. In this case, the source of the fourth N-type transistor N14 may be connected to the drain of the first N-type transistor N11 and the drain of the second N-type transistor N12.

A drain of the fifth N-type transistor N15 may be connected to a source of the sixth N-type transistor N16, and the ground voltage may be applied to a source of the fifth N-type transistor N15. A drain of the sixth N-type transistor N16 may be connected to the first node N1. The clock signal CK may be received through a gate of the fifth N-type transistor N15, and a gate of the sixth N-type transistor N16 is connected to the second node N2 so that the second internal signal IS2 may be received.

The second AOI gate circuit 12 may include first to third P-type transistors P21 to P23 and first to third N-type transistors N21 to N23.

A source of the first P-type transistor P21 may be connected to a drain of the second P-type transistor P22 and a drain of the third P-type transistor P23, and a drain of the first P-type transistor P21 may be connected to the second node N2 that is an output node of the second AOI gate circuit 12. A gate of the first P-type transistor P21 is connected to the first node N1 to receive a first internal signal (e.g., IS1 of FIG. 2).

A source of the second P-type transistor P22 and a source of the third P-type transistor P23 may be applied with the power supply voltage VDD. The clock signal CK may be received through a gate of the second P-type transistor P22, and a gate of the third P-type transistor P23 is connected to a third node N3 to receive a third internal signal (e.g., IS3 of FIG. 2).

The ground voltage may be applied to a source of the first N-type transistor N21, and a drain of the first N-type transistor N21 may be connected to the second node N2. A gate of the first N-type transistor N21 may be connected to the first node N1 to receive the first internal signal IS1.

The ground voltage may be applied to a source of the second N-type transistor N22, and a drain of the second N-type transistor N22 may be connected to a source of the third N-type transistor N23. A drain of the third N-type transistor N23 may be connected to the second node N2. A gate of the second N-type transistor N22 may receive the clock signal CK. A gate of the third N-type transistor N23 may be connected to the third node N3 to receive the third internal signal IS3.

The third AOI gate circuit 13 may include first to third P-type transistors P31 to P33 and first to third N-type transistors N31 to N33.

A source of the first P-type transistor P31 is connected to a drain of the second P-type transistor P32 and a drain of the third P-type transistor P33, and a drain of the first P-type transistor P31 may be connected to a fourth node N4 that is an output node of the third AOI gate circuit 13. A gate of the first P-type transistor P31 may be connected to the fifth node N5 to receive the fifth internal signal IS5 (e.g., IS5 of FIG. 2).

A source of the second P-type transistor P32 and a source of the third P-type transistor P33 may be applied with the power supply voltage VDD. A gate of the second P-type transistor P32 may receive the clock signal CK, and a gate of the third P-type transistor P33 may be connected to the second node N2 to receive the second internal signal IS2.

The ground voltage may be applied to a source of the first N-type transistor N31, and a drain of the first N-type transistor N31 may be connected to the fourth node N4. A gate of the first N-type transistor N31 may be connected to the fifth node N5 to receive the fifth internal signal IS5.

The ground voltage may be applied to a source of the second N-type transistor N32, and a drain of the second N-type transistor N32 may be connected to a source of the third N-type transistor N33. A drain of the third N-type transistor N33 may be connected to the fourth node N4. A gate of the second N-type transistor N32 may receive the clock signal CK, and a gate of the third N-type transistor N33 may be connected to the second node N2 to receive the second internal signal IS2.

The fourth AOI gate circuit 14 may include first to third P-type transistors P41 to P43 and first to third N-type transistors N41 to N43.

A source of the first P-type transistor P41 may be connected to a drain of the second P-type transistor P42 and a drain of the third P-type transistor P43, and a drain of the first P-type transistor P41 may be connected to the fifth node N5 that is an output node of the fourth AOI gate circuit 14. A gate of the first P-type transistor P41 is connected to the fourth node N4 to receive a fourth internal signal (e.g., IS4 of FIG. 2).

A source of the second P-type transistor P42 and a source of the third P-type transistor P43 may be applied with the power supply voltage VDD. A gate of the second P-type transistor P42 may receive the clock signal CK, and a gate of the third P-type transistor P43 is connected to the third node N3 so that the third internal signal IS3 may be received.

The ground voltage may be applied to a source of the first N-type transistor N41, and a drain of the first N-type transistor N41 may be connected to the fifth node N5. A gate of the first N-type transistor N41 may be connected to the fourth node N4.

The ground voltage may be applied to a source of the second N-type transistor N42, and a drain of the second N-type transistor N42 may be connected to a source of the third N-type transistor N43. A drain of the third N-type transistor N43 may be connected to the fifth node N5. A gate of the second N-type transistor N42 may receive the clock signal CK, and a gate of the third N-type transistor N43 may be connected to the third node N3.

Each of the first inverter circuit INV1 and the second inverter circuit INV2 may include one P-type transistor and one N-type transistor connected in series between the power supply voltage VDD and the ground voltage.

Figure 5:
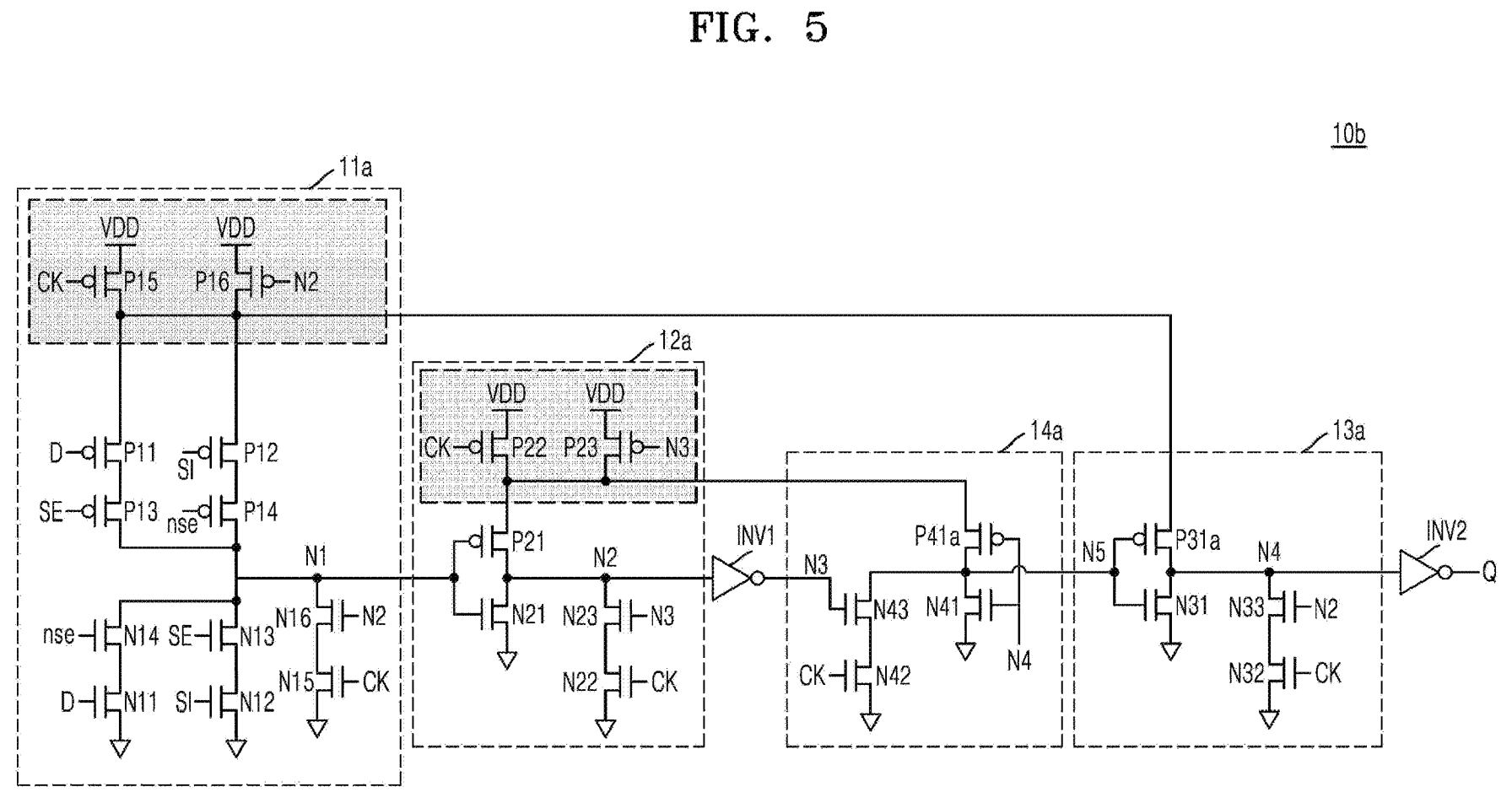

FIG. 5 is a circuit diagram illustrating a flip-flop 10b according to an embodiment. FIG. 5 is a circuit diagram showing the configuration of the flip-flop 10 excluding the third inverter circuit INV3 of FIG. 3.

Referring to FIG. 5, the flip-flop 10b may include a multiplexer and first AOI gate circuit 11a, a second AOI gate circuit 12a, a third AOI gate circuit 13a, a fourth AOI gate circuit 14a, a first inverter circuit INV1, and a second inverter circuit INV2.

The multiplexer and first AOI gate circuit 11a of FIG. 5 may correspond to the multiplexer and first AOI gate circuit 11 of FIG. 3. The second AOI gate circuits 12a of FIG. 5 may correspond to the second AOI gate circuit 12 of FIG. 3. The third AOI gate circuit 13a of FIG. 5 may correspond to the third AOI gate circuit 13 of FIG. 3, and the fourth AOI gate circuit 14a of FIG. 5 may correspond to the fourth AOI gate circuit 14 of FIG. 3. In the description of FIG. 5, redundant descriptions of the same reference numerals as in FIG. 4 will be omitted.

The third AOI gate circuit 13a may include a P-type transistor P31a and first to third N-type transistors N31 to N33. A drain of the P-type transistor P31a may be connected to a fourth node N4 that is an output node of the third AOI gate circuit 13a. A gate of the P-type transistor P31a is connected to the fifth node N5 to receive a fifth internal signal IS5 (e.g., IS5 in FIG. 2). A source of the P-type transistor P31a may be connected to a drain of the fifth P-type transistor P15 and a drain of the sixth P-type transistor P16 of the multiplexer and first AOI gate circuit 11a. Also, the source of the P-type transistor P31a may be connected to a source of the first P-type transistor P11 and a source of the second P-type transistor P12 of the multiplexer and first AOI gate circuit 11a.

The third AOI gate circuit 13a may share the fifth P-type transistor P15 and the sixth P-type transistor P16 with the multiplexer and first AOI gate circuit 11a. Accordingly, the third AOI gate circuit 13a may perform an AOI gate operation on a second internal signal (e.g., IS2 of FIG. 2), the clock signal CK, and the fifth internal signal IS5.

The fourth AOI gate circuit 14a may include a P-type transistor P41a and first to third N-type transistors N41 to N43. A drain of the P-type transistor P41a may be connected to a fifth node N5 that is an output node of the fourth AOI gate circuit 14a. A gate of the P-type transistor P41a may be connected to the fourth node N4 to receive a fourth internal signal (e.g., IS4 of FIG. 2). A source of the P-type transistor P41a may be connected to a drain of the second P-type transistor P22 and a drain of the third P-type transistor P23 of the second AOI gate circuit 12. Also, the source of the P-type transistor P41a may be connected to a source of the first P-type transistor P21 of the second AOI gate circuit 12a.

The fourth AOI gate circuit 14a may share the second P-type transistor P22 and the third P-type transistor P23 with the second AOI gate circuit 12a. Accordingly, the fourth AOI gate circuit 14a may perform an AOI gate operation on a third internal signal (e.g., IS3 of FIG. 2), the clock signal CK, and the fourth internal signal IS4.

As the third AOI gate circuit 13a shares the fifth P-type transistor P15 and the sixth P-type transistor P16 with the multiplexer and first AOI gate circuit 11a, and the fourth AOI gate circuit 14a shares the second P-type transistor P22 and the third P-type transistor P23 with the second AOI gate circuit 12a, the total number of transistors constituting the flip-flop 10b according to an embodiment may be reduced, and in particular, since the number of transistors operating according to operating the clock signal CK is reduced, the loading capacitance of the clock signal CK may be reduced and power consumption of the flip-flop 10b may be reduced.

Figure 6:
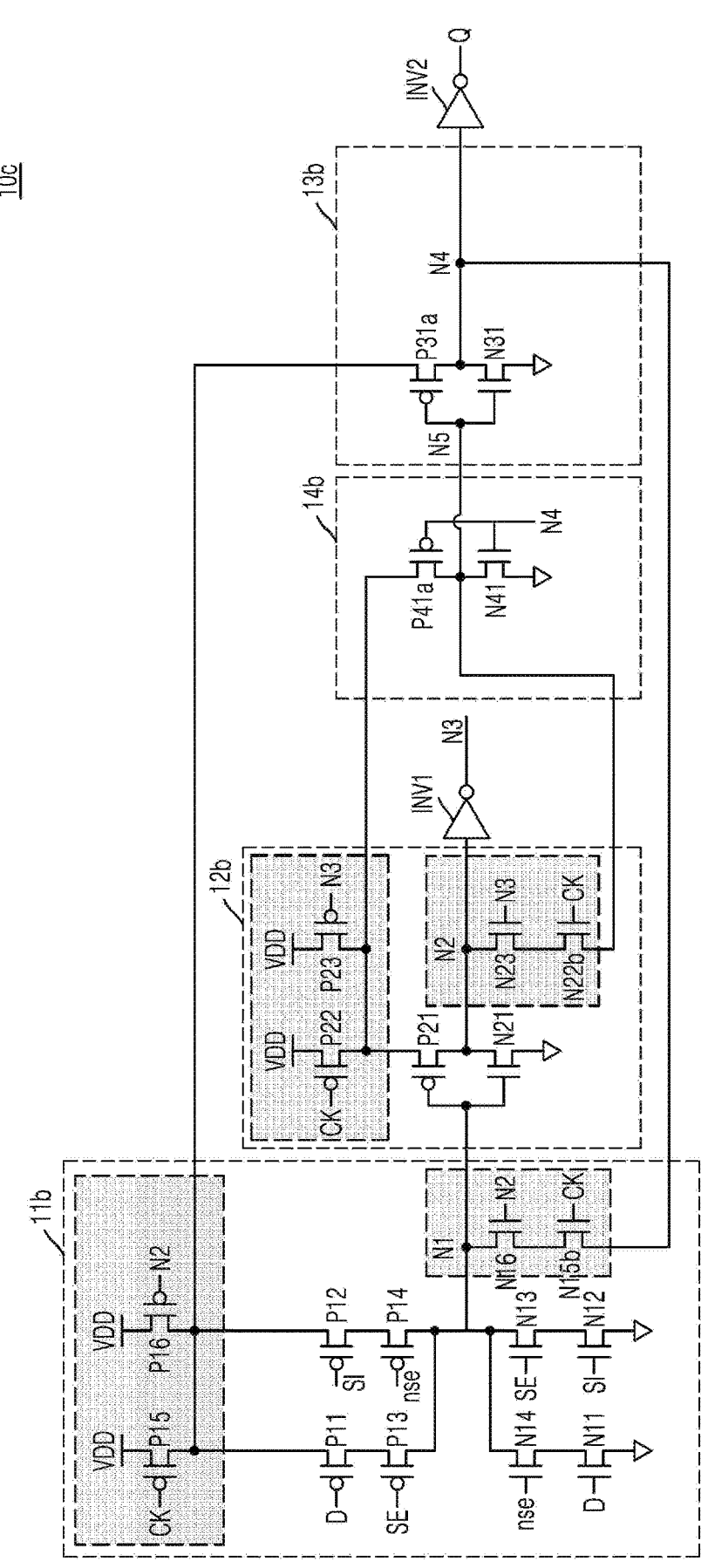

FIG. 6 is a circuit diagram illustrating a flip-flop 10c according to an example embodiment. FIG. 6 is a circuit diagram showing a configuration of the flip-flop 10 excluding the third inverter circuit INV3 of FIG. 3.

Referring to FIG. 6, the flip-flop 10c may include a multiplexer and first AOI gate circuit 11b, a second AOI gate circuit 12b, a third AOI gate circuit 13b, a fourth AOI gate circuit 14b, a first inverter circuit INV1, and a second inverter circuit INV2.

The multiplexer and first AOI gate circuit 11b of FIG. 6 may correspond to the multiplexer and first AOI gate circuit 11 of FIG. 3. The second AOI gate circuit 12b of FIG. 6 may correspond to the second AOI gate circuit 12 of FIG. 3. The third AOI gate circuit 13b of FIG. 6 may correspond to the third AOI gate circuit 13 of FIG. 3, and the fourth AOI gate circuit 14b of FIG. 6 may correspond to the fourth AOI gate circuit 14 of FIG. 3. In the description of FIG. 6, redundant descriptions of the same reference numerals as in FIG. 4 will be omitted.

The third AOI gate circuit 13b may include a P-type transistor P31a and an N-type transistor N31. A fourth node N4, which is an output node of the third AOI gate circuit 13b, may be connected to the multiplexer and first AOI gate circuit 11b and one end (e.g., source) of a fifth N-type transistor N15b of the multiplexer and first AOI gate circuit 11b. The third AOI gate circuit 13b may share a fifth P-type transistor P15, a sixth P-type transistor P16, the fifth N-type transistor N15b, and a sixth N-type transistor N16 with the multiplexer and first AOI gate circuit 11b. Accordingly, the third AOI gate circuit 13b may perform an AOI gate operation on a second internal signal (e.g., IS2 of FIG. 2), the clock signal CK, and the fifth internal signal IS5.

The fourth AOI gate circuit 14b may include a P-type transistor P41a and an N-type transistor N41. A fifth node N5 that is an output node of the fourth AOI gate circuit 14b may be connected to one end (e.g., source) of a second N-type transistor N22b of the second AOI gate circuit 12b. The fourth AOI gate circuit 14b may share a second P-type transistor P22, a third P-type transistor P23, the second N-type transistor N22b and a third N-type transistor N23 with the second AOI gate circuit 12b. Accordingly, the fourth AOI gate circuit 14b may perform an AOI gate operation on the third internal signal IS3, the clock signal CK, and a fourth internal signal (e.g., IS4 of FIG. 2).

In the flip-flop 10c according to the inventive concept, the third AOI gate circuit 13b may share the fifth P-type transistor P15, the sixth P-type transistor P16, the fifth N-type transistor N15b, and the sixth N-type transistor N16 with the multiplexer and first AOI gate circuit 11b. In addition, the fourth AOI gate circuit 14b may share the second P-type transistor P22, the third P-type transistor P23, the second N-type transistor N22b, and the third N-type transistor N23 with the second AOI gate circuit 12b. Therefore, the total number of transistors constituting the flip-flop 10c may be reduced, and in particular, since the number of transistors operating according to the clock signal CK is reduced, the loading capacitance of the clock signal CK may be reduced and power consumption of the flip-flop 10c may be reduced.

Figure 7:
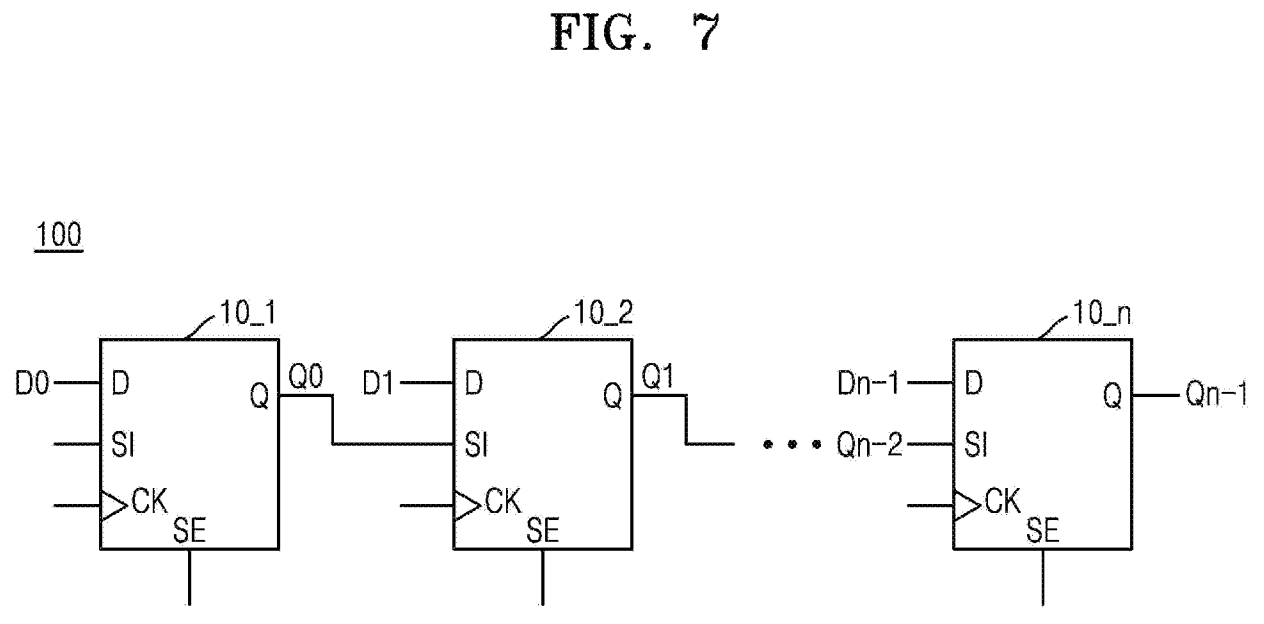
Figure 8:
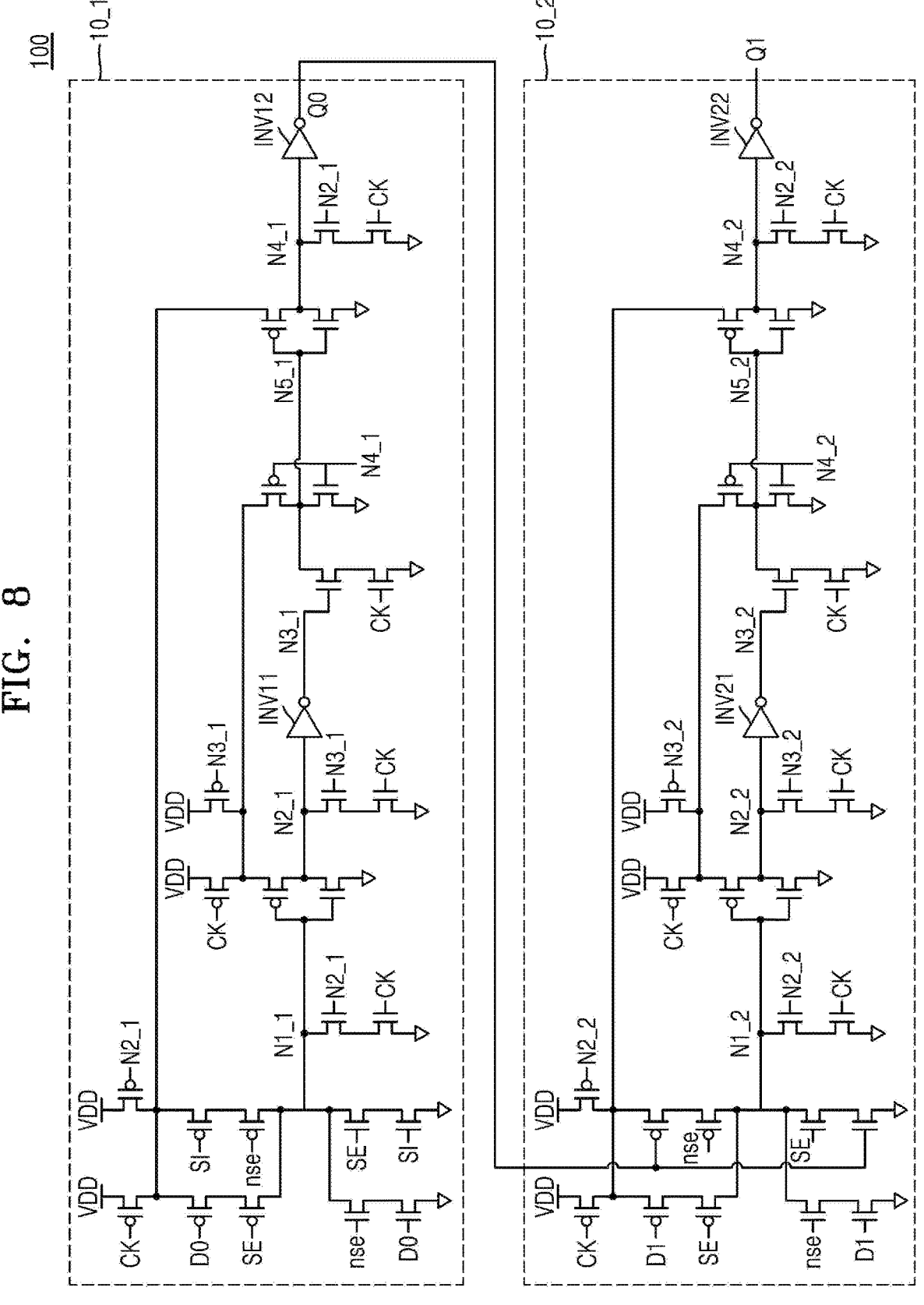
FIG. 8 is a circuit diagram illustrating a flip-flop according to an embodiment.

FIG. 7 is a diagram illustrating logic symbols of a flip-flop 100 according to an embodiment. FIG. 8 is a circuit diagram illustrating the flip-flop 100 according to an embodiment. FIG. 7 is a circuit diagram showing configurations of the number of flip-flops 10 of FIG. 3 connected in series and excluding an inverter circuit that receives the scan enable signal SE and generates an inverted scan enable signal nse.

Referring to FIG. 7, the flip-flop 100 may be a multi-bit flip-flop that receives multi-bit data input signals. The flip-flop 100 may include a plurality of 1-bit flip-flops, for example, first to n-th flip-flops 10_1 to 10_n (n is a natural number). Each of the first to nth flip-flops 10_1 to 10_n may have a scan chain structure in which an output signal of one 1-bit flip-flop is provided as a scan input signal to the next 1-bit flip-flop.

For example, the first flip-flop 10_1 may receive a 1-bit first data input signal D0, a scan input signal SI, and a scan enable signal SE, and output a first output signal Q0 according to the clock signal CK. The first output signal Q0 may be provided as a scan input signal SI to the second flip-flop 10_2. The second flip-flop 10_2 may receive a second data input signal D1, the first output signal Q0, and the scan enable signal SE, and output a second output signal Q1 according to the clock signal CK. The n-th flip-flop 10_n may receive an n-th data input signal Dn-1, an (n−1)-th output signal Qn-2, and the scan enable signal SE, and output an n-th output signal Qn-1 according to the clock signal CK.

Each of the first to n-th flip-flops 10_1 to 10_n may have the flip-flop circuit structure described with reference to FIGS. 4 to 6. For example, each of the first to nth flip-flops 10_1 to 10_n includes the multiplexer and first AOI gate circuit, the second AOI gate circuit, the third AOI gate circuit, the fourth AOI gate circuit, the first inverter circuit, and the second inverter circuit of FIGS. 4 to 6.

Referring to FIG. 8, each of the first flip-flop 10_1 and the second flip-flop 10_2 may have the circuit structure described with reference to FIG. 5. The first flip-flop 10_1 may receive a first data input signal D0, a scan input signal SI, a scan enable signal SE, an inverted scan enable signal nse, and a clock signal CK, and generate a first internal signal (e.g., IS1 in FIG. 2) at a first node N1_1, a second internal signal (e.g., IS2 in FIG. 2) at a second node N2_1, a third internal signal (e.g., IS3 in FIG. 2) at a third node N3_1, a fourth internal signal (e.g., IS4 in FIG. 2) at a fourth node N4_1, and a fifth internal signal (e.g., IS5 in FIG. 2) at a fifth node N5_1. The first output signal Q0 of the first flip-flop 10_1 may be provided to the second flip-flop 10_2 as a scan input signal SI. Accordingly, the first output signal Q0 of the first flip-flop 10_1 may be provided to a multiplexer and first AOI gate circuit of the second flip-flop 10_2.

The second flip-flop 10_2 may receive a second data input signal D1, the first output signal Q0, the scan enable signal SE, the inverted scan enable signal nse, and the clock signal CK, and generate a first internal signal (e.g., IS1 in FIG. 2) at a first node N1_2, a second internal signal (e.g., IS2 in FIG. 2) at a second node N2_2, a third internal signal (e.g., IS3 in FIG. 2) at a third node N3_2, a fourth internal signal (e.g., IS4 in FIG. 2) at a fourth node N4_2, and a fifth internal signal (e.g., IS5 in FIG. 2) at a fifth node N5_2. The second output signal Q1 of the second flip-flop 10_2 may be provided as a scan input signal SI to the third flip-flop 10_3 connected subsequent to the second flip-flop 10_2.

In FIGS. 7 and 8, the multi-bit flip-flop 100 having a scan chain structure in which the flip-flops 10 described with reference to FIG. 1 are continuously connected has been described, but the inventive concept is not limited thereto. The multi-bit flip-flop 100 may have a scan chain structure in which flip-flops 20 of FIG. 9 are continuously connected.

According to the inventive concept, since the number of transistors of each of the first to n-th flip-flops 10_1 to 10_n included in the multi-bit flip-flop 100 is reduced, the total number of transistors of the multi-bit flip-flop 100 may be also greatly reduced. Accordingly, power consumption of the multi-bit flip-flop 100 may also be effectively reduced.

Figure 9:
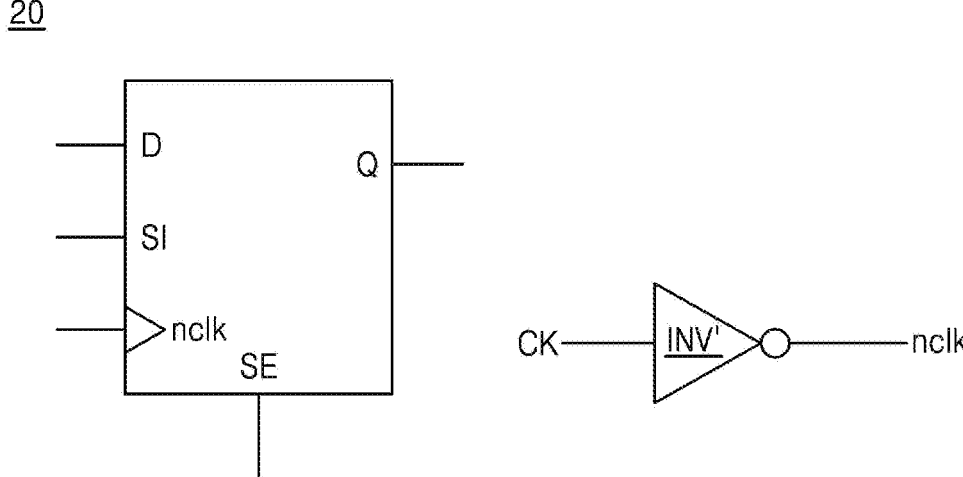
FIG. 9 is a diagram illustrating logic symbols of a flip-flop according to an embodiment.

FIG. 9 is a diagram illustrating logic symbols of a flip-flop 20 according to an embodiment. The flip-flop 20 may include a 1-bit flip-flop that receives a 1-bit data input signal D.

Referring to FIG. 9, the flip-flop 20 may receive a data input signal D, a scan input signal SI, and a scan enable signal SE, and output an output signal Q according to an inverted clock signal nclk. The flip-flop 20 may be included in a scan chain structure as a scan test circuit. The flip-flop 20 may further include an inverter circuit INV' generating an inverted clock signal nclk by inverting the clock signal CK.

The flip-flop 20 may store or latch the data input signal D based on the scan enable signal SE and the inverted clock signal nclk, and perform a scan test operation by selecting the scan input signal SI to output an output signal Q. The number of transistors operating according to the inverted clock signal nclk in the flip-flop 20 according to the inventive concept is reduced, so that a loading capacitance of the inverted clock signal nclk may be reduced, and power consumption of the flip-flop 20 may be reduced.

Figure 10:
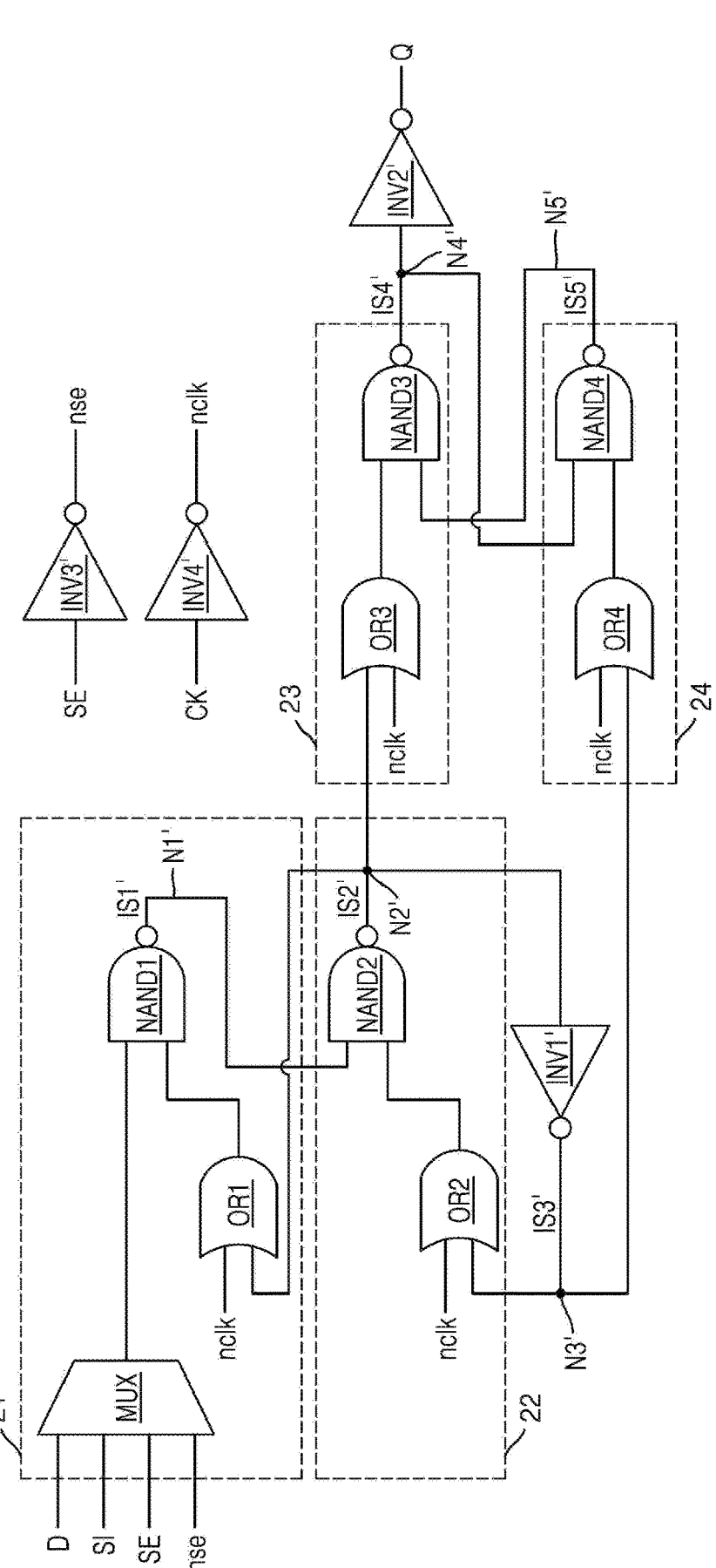
FIG. 10 is a logic diagram illustrating a flip-flop according to an embodiment.

FIG. 10 is a logic diagram illustrating a flip-flop 20 according to an embodiment.

Referring to FIG. 10, the flip-flop 20 may include a master section including first to third master stages MS1 to MS3, a slave section including first to third slave stages SS1 to SS3, a third inverter circuit INV3' and a fourth inverter circuit INV4'. The third inverter circuit INV3' may generate an inverted scan enable signal nse by inverting the scan enable signal SE, and the fourth inverter circuit INV4' is the inverter circuit INV' of FIG. 9 and may generate an inverted clock signal nclk by inverting the clock signal CK.

The first master stage MS1 may include a multiplexer and first OAI gate circuit 21, the second master stage MS2 may include a second OAI gate circuit 22, and the third master stage MS3 may include a first inverter circuit INV1'. The first slave stage SS1 may include a third OAI gate circuit 23, the second slave stage SS2 may include a fourth OAI gate circuit 24, and the third slave stage SS3 may include a second inverter circuit INV2'. The first OAI gate circuit 21, the second OAI gate circuit 22, the third OAI gate circuit 23, and the fourth OAI gate circuit 24 included in the master section and the slave section may be implemented as OAI21 gates.

The multiplexer and first OAI gate circuit 21 may perform operations of a multiplexer MUX, an OR gate OR1, and a NAND gate NAND1. The multiplexer MUX may provide the data input signal D or the scan input signal SI to the NAND gate NAND1 according to the logic level of the scan enable signal SE. The multiplexer MUX may receive not only the scan enable signal SE but also the inverted scan enable signal nse. The OR gate OR1 may perform an OR operation by receiving the inverted clock signal nclk and a second internal signal IS2', and the NAND gate NAND1 may receive an output of the multiplexer MUX and an output of the OR gate OR1, perform a NAND operation on the received inputs, and output a first internal signal IS1' to a first node N1'.

The second OAI gate circuit 22 may perform operations of an OR gate OR2 and a NAND gate NAND2. The OR gate OR2 may receive the inverted clock signal nclk and a third internal signal IS3' and perform an OR operation on the received inputs. The NAND gate NAND2 may receive the first internal signal IS1' and an output of the OR gate OR2, perform a NAND operation, and output the second internal signal IS2' to a second node N2'.

The first inverter circuit INV1' may generate the third internal signal IS3' by inverting the second internal signal IS2', and output the third internal signal IS3' to a third node N3'. Accordingly, the master section may provide the internal signal (i.e., the second internal signal IS2') and the inverted internal signal (i.e., the third internal signal IS3') to the slave section.

The third OAI gate circuit 23 may perform operations of an OR gate OR3 and a NAND gate NAND3. The OR gate OR3 may perform an OR operation by receiving the inverted clock signal nclk and the second internal signal IS2', and the NAND gate NAND3 may receive a fifth internal signal IS5' and an output of the OR gate OR3, perform a NAND operation, and output a fourth internal signal IS4' to a fourth node N4'.

The fourth OAI gate circuit 24 may perform operations of an OR gate OR4 and a NAND gate NAND4. The OR gate OR4 may receive the inverted clock signal nclk and the third internal signal IS3' and perform an OR operation. The NAND gate NAND4 may receive the fourth internal signal IS4' and the output of the OR gate OR4, perform a NAND operation, and output the fifth internal signal IS5' to a fifth node N5'.

The second inverter circuit INV2' may generate an output signal Q by inverting the fourth internal signal IS4', and may output the signal to an output terminal of the flip-flop 20.

Figure 11:
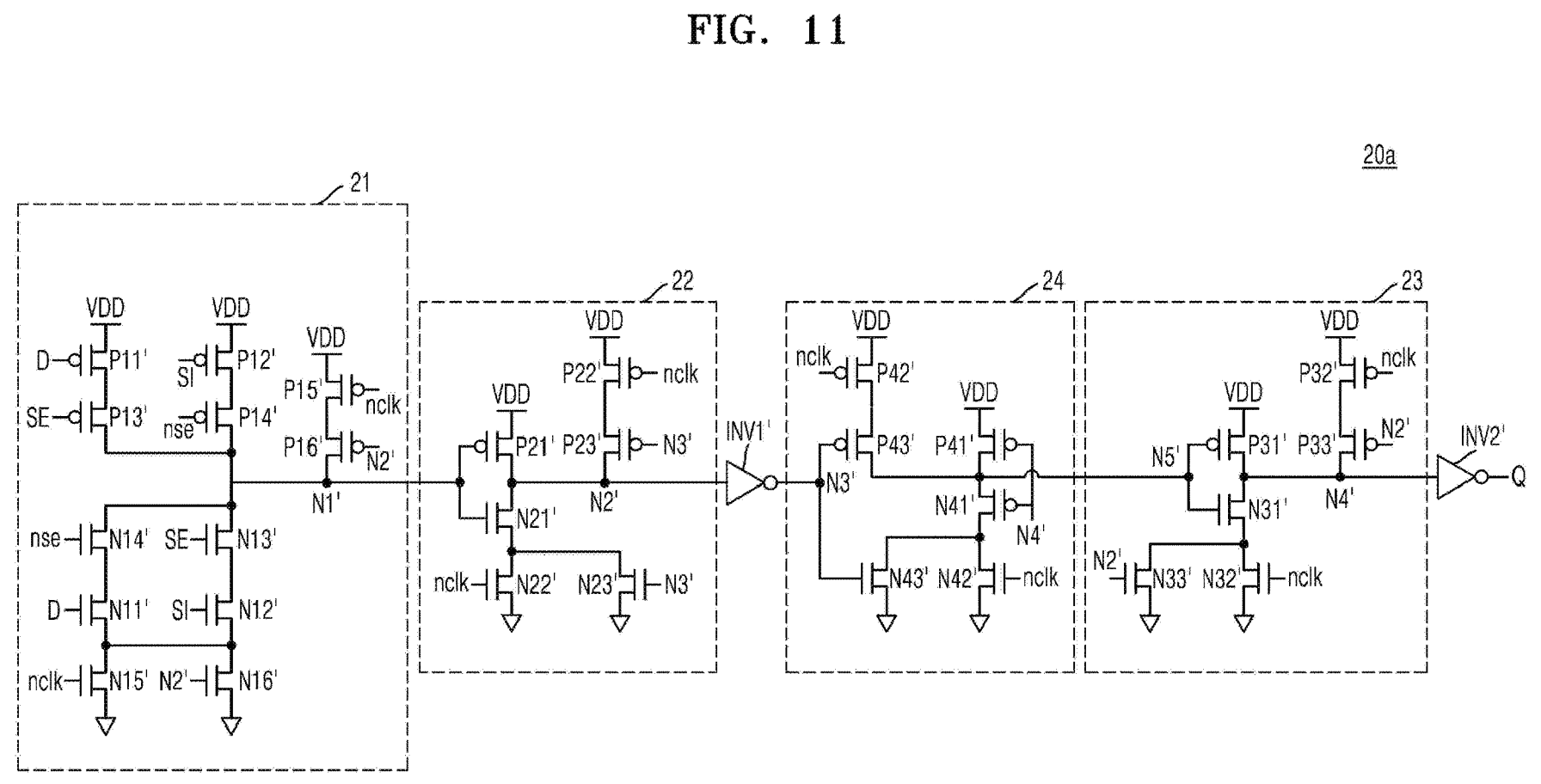

FIG. 11 is a circuit diagram illustrating a flip-flop 20a according to an embodiment. FIG. 11 is a circuit diagram showing the configuration of the flip-flop 20 excluding the third inverter circuit INV3' and the fourth inverter circuit INV4' of FIG. 10.

Referring to FIG. 11, the flip-flop 20a may include a multiplexer and first OAI gate circuit 21, a second OAI gate circuit 22, a third OAI gate circuit 23, a fourth OAI gate circuit 24, a first inverter circuit INV1', and a second inverter circuit INV2'.

The multiplexer and first OAI gate circuit 21 may include first to sixth P-type transistors P11' to P16' and first to sixth N-type transistors N11' to N16'. The multiplexer and first OAI gate circuit 21 may have a structure in which a multiplexer is coupled to an OAI gate.

The source of the first P-type transistor P11' is applied with the power supply voltage VDD, and a drain of the first P-type transistor P11' is connected to a source of the third P-type transistor P13'. The data input signal D may be received through the gate of the first P-type transistor P11'.

A source of the second P-type transistor P12' may be applied with the power supply voltage VDD, and a drain of the second P-type transistor P12' may be connected to a source of the fourth P-type transistor P14'. The scan input signal SI may be received through a gate of the second P-type transistor P12'.

A drain of the third P-type transistor P13' and a drain of the fourth P-type transistor P14' may be connected to a first node N1', which is an output node of the multiplexer and first OAI gate circuit 21. The scan enable signal SE may be received through a gate of the third P-type transistor P13', and the inverted scan enable signal nse may be received through a gate of the fourth P-type transistor P14'.

A source of the fifth P-type transistor P15' may be applied with the power supply voltage VDD, and a drain of the fifth P-type transistor P15' may be connected to a source of the sixth P-type transistor P16'. The inverted clock signal nclk may be received through a gate of the fifth P-type transistor P15'.

A drain of the sixth P-type transistor P16' may be connected to the first node N1'. A gate of the sixth P-type transistor P16' is connected to a second node N2', which is an output node of the second OAI gate circuit 22, so that a second internal signal (e.g., IS2' in FIG. 10) may be received.

A source of the first N-type transistor N11' and a source of the second N-type transistor N12' may be connected to a drain of the fifth N-type transistor N15' and a drain of the sixth N-type transistor N16', respectively. A drain of the first N-type transistor N11' may be connected to a source of the fourth N-type transistor N14', and a drain of the second N-type transistor N12' may be connected to a source of the third N-type transistor N13'. The data input signal D may be received through a gate of the first N-type transistor N11', and the scan input signal SI may be received through a gate of the second N-type transistor N12'.

A drain of the third N-type transistor N13' and a drain of the fourth N-type transistor N14' may be connected to a first node N1'. The scan enable signal SE may be received through a gate of the third N-type transistor N13', and the inverted scan enable signal nse may be received through a gate of fourth N-type transistor N14'.

The ground voltage may be applied to a source of the fifth N-type transistor N15' and a source of the sixth N-type transistor N16'. The inverted clock signal nclk may be received through a gate of the fifth N-type transistor N15', and a gate of the sixth N-type transistor N16' is connected to the second node N2' so that the second internal signal IS2' may be received.

The second OAI gate circuit 22 may include first to third P-type transistors P21' to P23' and first to third N-type transistors N21' to N23'.

The power supply voltage VDD may be applied to a source of the first P-type transistor P21', and a drain of the first P-type transistor P21' may be connected to the second node N2' which is an output node of the second OAI gate circuit 22. A gate of the first P-type transistor P21' is connected to the first node N1' to receive a first internal signal (e.g., IS1' in FIG. 10).

A source of the second P-type transistor P22' may be applied with the power supply voltage VDD, and a drain of the second P-type transistor P22' may be connected to a source of the third P-type transistor P23'. The inverted clock signal nclk may be received through a gate of the second P-type transistor P22'.

A drain of the third P-type transistor P23' may be connected to the second node N2'. A gate of the third P-type transistor P23' is connected to a third node N3' to receive a third internal signal (e.g., IS3' in FIG. 10).

A source of the first N-type transistor N21' may be connected to a drain of the second N-type transistor N22' and a drain of the third N-type transistor N23'. A drain of the first N-type transistor N21' may be connected to the second node N2'. A gate of the first N-type transistor N21' may be connected to the first node N1' to receive the first internal signal IS1'.

The ground voltage may be applied to a source of the second N-type transistor N22' and a source of the third N-type transistor N23'. A gate of the second N-type transistor N22' may receive the inverted clock signal nclk. A gate of the third N-type transistor N23' may be connected to the third node N3' to receive the third internal signal IS3'.

The third OAI gate circuit 23 may include first to third P-type transistors P31' to P33' and first to third N-type transistors N31' to N33'.

A source of the first P-type transistor P31' is applied with the power supply voltage VDD, and a drain of the first P-type transistor P31' may be connected to a fourth node N4' that is an output node of the third OAI gate circuit 23. A gate of the first P-type transistor P31' may be connected to a fifth node N5' to receive a fifth internal signal (e.g., IS5' in FIG. 10).

A source of the second P-type transistor P32' may be applied with the power supply voltage VDD, and a drain of the second P-type transistor P32' may be connected to a source of the third P-type transistor P33'. A gate of the second P-type transistor P32' may receive the inverted clock signal nclk.

A drain of the third P-type transistor P33' may be connected to a fourth node N4'. A gate of the third P-type transistor P33' may be connected to the second node N2' to receive the second internal signal IS2'.

A source of the first N-type transistor N31' is connected to a drain of the second N-type transistor N32' and a drain of the third N-type transistor N33', and a drain of the first N-type transistor N31' may be connected to the fourth node N4'. A gate of the first N-type transistor N31' may be connected to the fifth node N5' to receive the fifth internal signal IS5'.

The ground voltage may be applied to a source of the second N-type transistor N32' and a source of the third N-type transistor N33'. A gate of the second N-type transistor N32' may receive the inverted clock signal nclk, and a gate of the third N-type transistor N33' may be connected to the second node N2' to receive the second internal signal IS2'.

The fourth OAI gate circuit 24 may include first to third P-type transistors P41' to P43' and first to third N-type transistors N41' to N43'.

A source of the first P-type transistor P41' is applied with the power supply voltage VDD, and a drain of the first P-type transistor P41 ' may be connected to the fifth node N5' that is an output node of the fourth OAI gate circuit 24. A gate of the first P-type transistor P41' is connected to the fourth node N4' to receive a fourth internal signal (e.g., IS4' of FIG. 10).

A source of the second P-type transistor P42' may be applied with the power supply voltage VDD, and a drain of the second P-type transistor P42' may be connected to a source of the third P-type transistor P43'. The inverted clock signal nclk may be received at a gate of the second P-type transistor P42'.

A drain of the third P-type transistor P43' may be connected to the fifth node N5'. A gate of the third P-type transistor P43' is connected to the third node N3' so that the third internal signal IS3' may be received.

A source of the first N-type transistor N41' may be connected to a drain of the second N-type transistor N42' and a drain of the third N-type transistor N43'. A drain of the first N-type transistor N41' may be connected to the fifth node N5'. A gate of the first N-type transistor N41' may be connected to the fourth node N4' to receive the fourth internal signal IS4'.

The ground voltage may be applied to a source of the second N-type transistor N42' and a source of the third N-type transistor N43'. A gate of the second N-type transistor N42' may receive the inverted clock signal nclk, and a gate of the third N-type transistor N43' may be connected to the third node N3' to receive the third internal signal IS3'.

Figure 12:
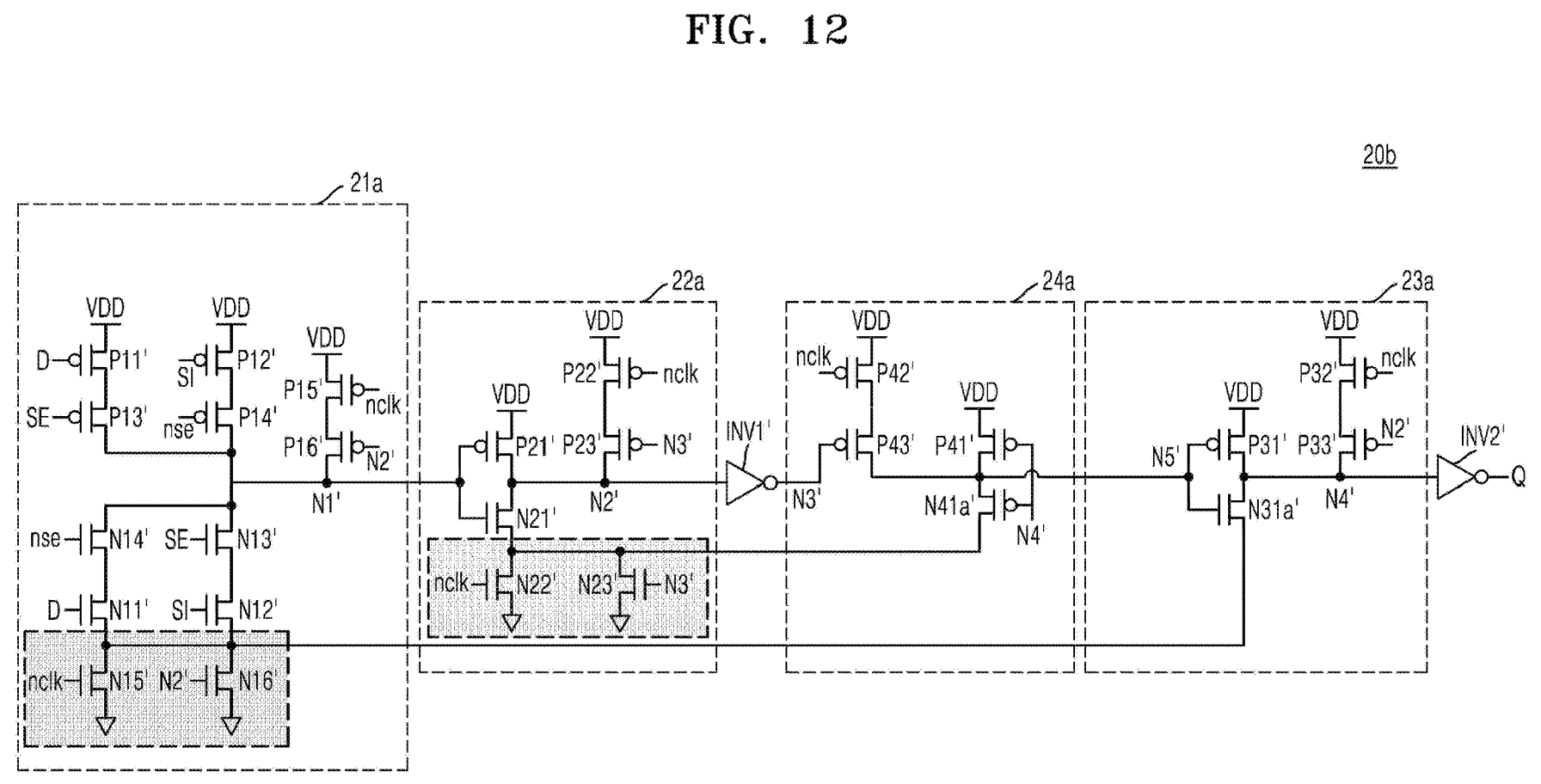

FIG. 12 is a circuit diagram illustrating a flip-flop 20b according to an embodiment. FIG. 12 is a circuit diagram showing the configuration of the flip-flop 20 excluding the third inverter circuit INV3' and the fourth inverter circuit INV4' of FIG. 10.

Referring to FIG. 12, the flip-flop 20b may include a multiplexer and first OAI gate circuit 21a, a second OAI gate circuit 22a, a third OAI gate circuit 23a, a fourth OAI gate circuit 24a, a first inverter circuit INV1', and a second inverter circuit INV2'. The multiplexer and first OAI gate circuit 21a of FIG. 12 may correspond to the multiplexer and first OAI gate circuit 21 of FIG. 11. The second OAI gate circuit 22a of FIG. 12 may correspond to the second OAI gate circuit 22 of FIG. 11. The third OAI gate circuit 23a of FIG. 12 may correspond to the third OAI gate circuit 23 of FIG. 11, and the fourth OAI gate circuit 24a of FIG. 12 may correspond to the fourth OAI gate circuit 24 of FIG. 11. In the description of FIG. 12, redundant descriptions of the same symbols as in FIG. 11 will be omitted.

The multiplexer and first OAI gate circuit 21a may include first to sixth P-type transistors P11' to P16' and first to sixth N-type transistors N11' to N16'.

The second OAI gate circuit 22a may include first to third P-type transistors P21' to P23' and first to third N-type transistors N21' to N23'.

The third OAI gate circuit 23a may include first to third P-type transistors P31' to P33' and an N-type transistor N31a'. A drain of the N-type transistor N31a' may be connected to a fourth node N4' that is an output node of the third OAI gate circuit 23a. A gate of the N-type transistor N31a' may be connected to a fifth node N5' to receive a fifth internal signal (e.g., IS5' in FIG. 10). A source of the N-type transistor N31a' may be connected to a drain of the fifth N-type transistor N15' and a drain of the sixth N-type transistor N16' of the multiplexer and first OAI gate circuit 21. In addition, the source of the N-type transistor N31a' may be connected to the source of the first N-type transistor N11' and the source of the second N-type transistor N12' of the multiplexer and first OAI gate circuit 21a.

The third OAI gate circuit 23a may share the fifth N-type transistor N15' and the sixth N-type transistor N16' with the multiplexer and first OAI gate circuit 21a. Accordingly, the third OAI gate circuit 23a may perform an OAI gate operation on a second internal signal (e.g., IS2' in FIG. 10), the inverted clock signal nclk, and the fifth internal signal IS5'.

The fourth OAI gate circuit 24a may include first to third P-type transistors P41' to P43' and an N-type transistor N41a'. A drain of the N-type transistor N41a' may be connected to a fifth node N5' that is an output node of the fourth OAI gate circuit 24a. A gate of the N-type transistor N41a' may be connected to the fourth node N4' to receive a fourth internal signal (e.g., IS4' in FIG. 10). A source of the N-type transistor N41a' may be connected to a drain of the second N-type transistor N22' and a drain of the third N-type transistor N23' of the second OAI gate circuit 22a. Also, the source of the N-type transistor N41a' may be connected to a source of the first N-type transistor N21' of the second OAI gate circuit 22a.

The fourth OAI gate circuit 24a may share the second N-type transistor N22' and the third N-type transistor N23' with the second OAI gate circuit 22a. Accordingly, the fourth OAI gate circuit 24a may perform an OAI gate operation on a third internal signal (e.g., IS3' in FIG. 10), the inverted clock signal nclk, and the fourth internal signal IS4'.

As the third OAI gate circuit 23a shares the fifth N-type transistor N15' and the sixth N-type transistor N16' with the multiplexer and first OAI gate circuit 21a, and the fourth OAI gate circuit 24a shares the second N-type transistor N22' and the third N-type transistor N23' with the second OAI gate circuit 22a, the total number of transistors constituting the flip-flop 20b may be reduced, and in particular, since the number of transistors operating on the inverted clock signal nclk is reduced, the loading capacitance of the inverted clock signal nclk may be reduced and power consumption of the flip-flop 20b may be reduced.

Figure 13:
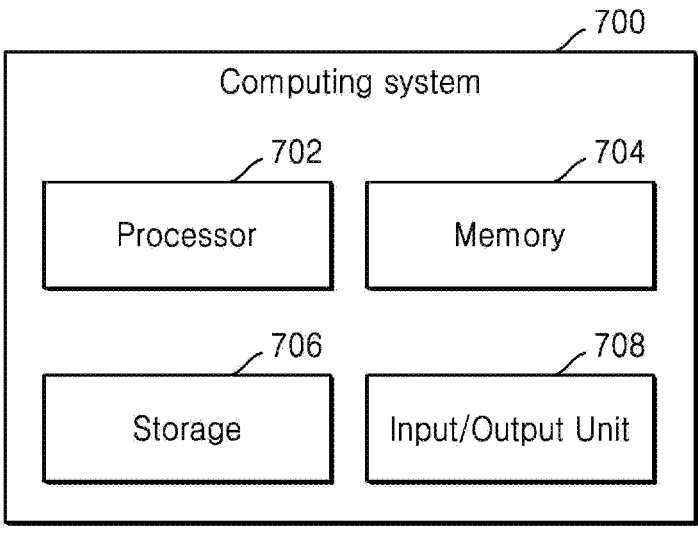
FIG. 13 is a block diagram illustrating a computing system including a flip-flop according to an embodiment.

FIG. 13 is a block diagram illustrating a computing system 700 including at least one of the flip-flops 10, 100, and 20 described above according to an embodiment.

Referring to FIG. 13, the computing system 700 may include a processor 702, a memory 704, a storage 706, an input/output unit 708, and the like. In an embodiment, at least one of a plurality of semiconductor devices, integrated circuits, sequential logic circuits, etc. included in the processor 702, the memory 704, the storage 706, and the input/output unit 708 may include one of the 1-bit flip-flops 10 and 20 described with reference to FIGS. 1 and 9, or may include the multi-bit flip-flop 100 described with reference to FIG. 7. The computing system 700 may be a fixed computing system, such as a desktop computer, a workstation, a server, and the like and may be a portable computing system, such as a laptop computer.

The processor 702 may perform certain operations or tasks. The processor 121 may be referred to as a processing unit and may include at least one core capable of executing an arbitrary instruction set, for example, such as a microprocessor, an application processor (AP), a digital signal processor (DSP), and a graphic processing unit (GPU). The processor 702 may communicate with the memory 704, the storage 706, and the input/output unit 708 via a bus, such as an address bus, control bus, data bus, or the like. The processor 702 may also be coupled to an expansion bus, such as a Peripheral Component Interconnect (PCI) bus.

The memory 704 may store data necessary for the operation of the computing system 700. The memory 704 may store programs executable by the processor 702. The memory 704 may include one or more computer readable storage media. For example, memory 704 may be non-volatile memory and may include a form of a magnetic hard disk, an optical disk, a floppy disk, flash memory, an electrically programmable memory (EPROM), or an electrically erasable programmable (EEPROM) memory. In addition, the memory 704 may be implemented as a random access memory (RAM) or a cache, and for example, the memory 704 may include a dynamic random access memory (DRAM), a mobile DRAM, a static random access memory (SRAM), a phase-change random access memory (PRAM), a ferroelectric random access memory (FRAM), a resistive random access memory (RRAM), a magnetic random access memory (MRAM), and the like.

The storage 706 may not lose stored data even if power supplied to the computing system 700 is cut off. For example, storage 706 may include nonvolatile memory devices, and may include storage media, such as magnetic tape, optical disks, magnetic disks, solid state drives (SSDs), hard disk drives, CD-ROMs, and the like.

The input/output unit 708 may include input units, such as a keyboard, a keypad, and a mouse, and output units, such as a printer and a display.

While the inventive concept has been particularly shown and described with reference to embodiments thereof, it will be understood that various changes in form and details may be made therein without departing from the spirit and scope of the following claims.

What is claimed is:

1. A flip-flop comprising:
a master section including a multiplexer, a first AND-OR-Inverter (AOI) gate circuit, a second AOI gate circuit, and a first inverter circuit, and configured to:
receive a data input signal, a scan input signal, a scan enable signal, and an inverted scan enable signal,
output a second internal signal based on a first internal signal and a third internal signal, and
output the third internal signal based on the second internal signal;
a slave section including a third AOI gate circuit, a fourth AOI gate circuit, and a second inverter circuit, and configured to:
receive the second internal signal and the third internal signal, and
generate an output signal based on the second internal signal and the third internal signal; and
a third inverter circuit configured to generate the inverted scan enable signal obtained by inverting the scan enable signal,
wherein the first to fourth AOI gate circuits included in the master section and the slave section are configured to receive a clock signal, and
wherein the first inverter circuit is configured to receive the second internal signal and output the third internal signal based on the second internal signal.

2. The flip-flop of claim 1, wherein:
the multiplexer and first AOI gate circuit comprises first to sixth P-type transistors and first to sixth N-type transistors,
a source of the first P-type transistor is connected to a drain of the fifth P-type transistor and a drain of the sixth P-type transistor, and a drain of the first P-type transistor is connected to a source of the third P-type transistor,
a source of the second P-type transistor is connected to the drain of the fifth P-type transistor and the drain of the sixth P-type transistor, and a drain of the second P-type transistor is connected to a source of the fourth P-type transistor,
a drain of the third P-type transistor and a drain of the fourth P-type transistor are connected to an output node of the multiplexer and first AOI gate circuit, a power supply voltage is applied to a source of the fifth P-type transistor and a source of the sixth P-type transistor,
a ground voltage is applied to a source of the first N-type transistor, and a drain of the first N-type transistor is connected to a source of the fourth N-type transistor,
the ground voltage is applied to a source of the second N-type transistor, and a drain of the second N-type transistor is connected to a source of the third N-type transistor,
a drain of the fifth N-type transistor is connected to a source of the sixth N-type transistor, and
a drain of the third N-type transistor, a drain of the fourth N-type transistor, and a drain of the sixth N-type transistor are connected to the output node of the multiplexer and first AOI gate circuit.

3. The flip-flop of claim 2, wherein:
a gate of the first P-type transistor and a gate of the first N-type transistor are configured to receive the data input signal,
a gate of the second P-type transistor and a gate of the second N-type transistor are configured to receive the scan input signal,
a gate of the third P-type transistor and a gate of the third N-type transistor are configured to receive the scan enable signal,
a gate of the fourth P-type transistor and a gate of the fourth N-type transistor are configured to receive the inverted scan enable signal,
a gate of the fifth P-type transistor and a gate of the fifth N-type transistor are configured to receive the clock signal, and
a gate of the sixth P-type transistor and a gate of the sixth N-type transistor are configured to receive the second internal signal.

4. The flip-flop of claim 2, wherein:
a gate of the third P-type transistor and a gate of the first N-type transistor are configured to receive the data input signal,
a gate of the second P-type transistor and a gate of the second N-type transistor are configured to receive the scan input signal,
a gate of the first P-type transistor and a gate of the third N-type transistor are configured to receive the scan enable signal,
a gate of the fourth P-type transistor and a gate of the fourth N-type transistor are configured to receive the inverted scan enable signal,
a gate of the fifth P-type transistor and a gate of the fifth N-type transistor are configured to receive the clock signal,
a gate of the sixth P-type transistor and a gate of the sixth N-type transistor are configured to receive the second internal signal, and
the source of the third P-type transistor is connected to the drains of the first and second P-type transistors.

5. The flip-flop of claim 2, wherein:
a gate of the first P-type transistor and a gate of the first N-type transistor are configured to receive the data input signal,
a gate of the fourth P-type transistor and a gate of the second N-type transistor are configured to receive the scan input signal,
a gate of the third P-type transistor and a gate of the third N-type transistor are configured to receive the scan enable signal, a gate of the second P-type transistor and a gate of the fourth N-type transistor are configured to receive the inverted scan enable signal, a gate of the fifth P-type transistor and a gate of the fifth N-type transistor are configured to receive the clock signal, and a gate of the sixth P-type transistor and a gate of the sixth N-type transistor are configured to receive the second internal signal, and the source of the third P-type transistor is connected to the drains of the first and second P-type transistors.

6. The flip-flop of claim 2, wherein:

a gate of the first P-type transistor and a gate of the fourth N-type transistor are configured to receive the data input signal, a gate of the second P-type transistor and a gate of the second N-type transistor are configured to receive the scan input signal, a gate of the third P-type transistor and a gate of the third N-type transistor are configured to receive the scan enable signal, a gate of the fourth P-type transistor and a gate of the first N-type transistor are configured to receive the inverted scan enable signal, a gate of the fifth P-type transistor and a gate of the fifth N-type transistor are configured to receive the clock signal, a gate of the sixth P-type transistor and a gate of the sixth N-type transistor are configured to receive the second internal signal, and the drain of the first N-type transistor is connected to the sources of the third and fourth N-type transistors.

7. The flip-flop of claim 2, wherein:

a gate of the first P-type transistor and a gate of the first N-type transistor are configured to receive the data input signal, a gate of the second P-type transistor and a gate of the third N-type transistor are configured to receive the scan input signal, a gate of the third P-type transistor and a gate of the second N-type transistor are configured to receive the scan enable signal, a gate of the fourth P-type transistor and a gate of the fourth N-type transistor are configured to receive the inverted scan enable signal, a gate of the fifth P-type transistor and a gate of the fifth N-type transistor are configured to receive the clock signal, a gate of the sixth P-type transistor and a gate of the sixth N-type transistor are configured to receive the second internal signal, and the drain of the first N-type transistor is connected to the sources of the third and fourth N-type transistors.

8. The flip-flop of claim 2, wherein:

the third AOI gate circuit comprises a seventh P-type transistor and seventh to ninth N-type transistors, a source of the seventh P-type transistor is connected to the drain of the fifth P-type transistor, a drain of the seventh P-type transistor is connected to an output node of the third AOI gate circuit, the ground voltage is applied to a source of the seventh N-type transistor, and a drain of the seventh N-type transistor is connected to the output node of the third AOI gate circuit, the ground voltage is applied to a source of the eighth N-type transistor, and a drain of the eighth N-type transistor is connected to a source of the ninth N-type transistor, and a drain of the ninth N-type transistor is connected to the output node of the third AOI gate circuit.

9. The flip-flop of claim 8, wherein:

a gate of the seventh P-type transistor and a gate of the seventh N-type transistor are connected to an output node of the fourth AOI gate circuit, a gate of the eighth N-type transistor is configured to receive the clock signal, and a gate of the ninth N-type transistor is configured to receive the second internal signal.

10. The flip-flop of claim 2, wherein:

the third AOI gate circuit comprises a seventh P-type transistor and a seventh N-type transistor, a source of the seventh P-type transistor is connected to the drain of the fifth P-type transistor, a drain of the seventh P-type transistor is connected to an output node of the third AOI gate circuit, the ground voltage is applied to a source of the seventh N-type transistor, and a drain of the seventh N-type transistor is connected to the output node of the third AOI gate circuit, and the output node of the third AOI gate circuit is connected to a source of the fifth N-type transistor.

11. The flip-flop of claim 1, wherein:

the second AOI gate circuit comprises first to third P-type transistors and first to third N-type transistors, a source of the first P-type transistor is connected to a drain of the second P-type transistor and a drain of the third P-type transistor, and a drain of the first P-type transistor is connected to an output node of the second AOI gate circuit, a power supply voltage is applied to a source of the second P-type transistor and a source of the third P-type transistor, a ground voltage is applied to a source of the first N-type transistor, and a drain of the first N-type transistor is connected to the output node of the second AOI gate circuit, a drain of the second N-type transistor is connected to a source of the third N-type transistor, and a drain of the third N-type transistor is connected to the output node of the second AOI gate circuit.

12. The flip-flop of claim 11, wherein:

the second internal signal is output from the output node of the second AOI gate circuit, a gate of the first P-type transistor and a gate of the first N-type transistor are connected to an output node of the multiplexer and first AOI gate circuit, a gate of the second P-type transistor and a gate of the second N-type transistor are configured to receive the clock signal, and a gate of the third P-type transistor and a gate of the third N-type transistor are configured to receive the third internal signal.

13. The flip-flop of claim 11, wherein:

the fourth AOI gate circuit comprises a fourth P-type transistor and fourth to sixth N-type transistors, a source of the fourth P-type transistor is connected to the drain of the second P-type transistor, a drain of the fourth P-type transistor is connected to an output node of the fourth AOI gate circuit, the ground voltage is applied to a source of the fourth N-type transistor, and a drain of the fourth N-type transistor is connected to the output node of the fourth AOI gate circuit, the ground voltage is applied to a source of the fifth N-type transistor, and a drain of the fifth N-type transistor is connected to a source of the sixth N-type transistor, and a drain of the sixth N-type transistor is connected to the output node of the fourth AOI gate circuit.

14. The flip-flop of claim 13, wherein:

a gate of the fourth P-type transistor and a gate of the fourth N-type transistor of the fourth AOI gate circuit are connected to an output node of the third AOI gate circuit, a gate of the fifth N-type transistor is configured to receive the clock signal, and a gate of the sixth N-type transistor is configured to receive the third internal signal.

15. The flip-flop of claim 11, wherein:

the fourth AOI gate circuit comprises a fourth P-type transistor and a fourth N-type transistor, a source of the fourth P-type transistor is connected to the drain of the second P-type transistor, a drain of the fourth P-type transistor is connected to an output node of the fourth AOI gate circuit, the ground voltage is applied to a source of the fourth N-type transistor, and a drain of the fourth N-type transistor is connected to the output node of the fourth AOI gate circuit, and the output node of the fourth AOI gate circuit is connected to a source of the second N-type transistor.

16. The flip-flop of claim 1, wherein:

the third AOI gate circuit comprises first to third P-type transistors and first to third N-type transistor, a source of the first P-type transistor is connected to a drain of the second P-type transistor and a drain of the third P-type transistor, and a drain of the first P-type transistor is connected to an output node of the third AOI gate circuit, a power supply voltage is applied to a source of the second P-type transistor and a source of the third P-type transistor, a ground voltage is applied to a source of the first N-type transistor, and a drain of the first N-type transistor is connected to the output node of the third AOI gate circuit, the ground voltage is applied to a source of the second N-type transistor, and a drain of the second N-type transistor is connected to a source of the third N-type transistor, and a drain of the third N-type transistor is connected to the output node of the third AOI gate circuit.

17. The flip-flop of claim 1, wherein:

the fourth AOI gate circuit comprises first to third P-type transistors and first to third N-type transistors, a source of the first P-type transistor is connected to a drain of the second P-type transistor and a drain of the third P-type transistor, and a drain of the first P-type transistor is connected to an output node of the fourth AOI gate circuit, a power supply voltage is applied to a source of the second P-type transistor and a source of the third P-type transistor, a ground voltage is applied to a source of the first N-type transistor, and a drain of the first N-type transistor is connected to the output node of the fourth AOI gate circuit, the ground voltage is applied to a source of the second N-type transistor, and a drain of the second N-type transistor is connected to a source of the third N-type transistor, and a drain of the third N-type transistor is connected to the output node of the fourth AOI gate circuit.

* * * * *